United States Patent
Lee et al.

(10) Patent No.: US 10,510,917 B2
(45) Date of Patent: Dec. 17, 2019

(54) PORTABLE ELECTRONIC DEVICE, IMAGE-CAPTURING MODULE THEREOF AND CARRIER ASSEMBLY THEREOF

(71) Applicant: AZUREWAVE TECHNOLOGIES, INC., New Taipei (TW)

(72) Inventors: Tseng-Chieh Lee, New Taipei (TW); Kung-An Lin, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 15/675,311

(22) Filed: Aug. 11, 2017

(65) Prior Publication Data
US 2018/0337302 A1    Nov. 22, 2018

(30) Foreign Application Priority Data
May 22, 2017 (TW) .............................. 106116881 A

(51) Int. Cl.
| | |
|---|---|
| *H01L 31/113* | (2006.01) |
| *H01L 31/0203* | (2014.01) |
| *H01L 31/0232* | (2014.01) |
| *H01L 31/024* | (2014.01) |
| *H01L 31/101* | (2006.01) |

(52) U.S. Cl.
CPC ...... *H01L 31/1136* (2013.01); *H01L 31/0203* (2013.01); *H01L 31/024* (2013.01); *H01L 31/0232* (2013.01); *H01L 31/101* (2013.01)

(58) Field of Classification Search
CPC ............. H01L 31/1136; H01L 31/0203; H01L 31/0232; H01L 31/024; H01L 31/101; H01L 27/14618; H01L 27/14683; H01L 31/02325; H04N 5/2251; H04N 5/2257

USPC .......... 257/680, E31.117, E31.127, E31.118, 257/E31.128; 438/64, 65, 109; 348/335, 348/374, E5.024

See application file for complete search history.

(56) References Cited

U.S. PATENT DOCUMENTS

2012/0105713 A1*   5/2012   Luan .................... H04N 5/2251
                                                                   348/374

FOREIGN PATENT DOCUMENTS

| CN | 204945470 | 1/2016 |
|---|---|---|
| JP | 2004282227 A | 10/2004 |

(Continued)

*Primary Examiner* — Mouloucoulaye Inoussa
(74) *Attorney, Agent, or Firm* — Li & Cai Intellectual Property (USA) Offoce

(57) ABSTRACT

The present invention provides a portable electronic device, an image-capturing module thereof and a carrier assembly thereof. The image-capturing module includes a circuit substrate, an image-sensing chip, at least one electronic component, a dispensing package, and a lens assembly. The circuit substrate has a top surface and a bottom surface. The image-sensing chip is electrically connected to the circuit substrate, and the image-sensing chip has an image-sensing area. The at least one electronic component is disposed on the bottom surface of the circuit substrate and electrically connected to the circuit substrate. The dispensing package is disposed on the bottom surface of the circuit substrate to cover the at least one electronic component. The lens assembly includes a holder structure disposed on the top surface of the circuit substrate and a lens structure being held by the holder structure and corresponding to the image-sensing area.

6 Claims, 13 Drawing Sheets

(56) References Cited

FOREIGN PATENT DOCUMENTS

| | | | |
|---|---|---|---|
| JP | 2005328559 | A | 11/2005 |
| JP | 2009070882 | A | 4/2009 |
| JP | 2011018736 | A | 1/2011 |
| JP | 2012238687 | A | 12/2012 |
| JP | 2016162992 | A | 9/2016 |
| KR | 100915134 | | 9/2009 |

* cited by examiner

PORTABLE ELECTRONIC DEVICE, IMAGE-CAPTURING MODULE THEREOF AND CARRIER ASSEMBLY THEREOF

FIELD OF THE INVENTION

The present disclosure relates to a portable electronic device, an image-capturing module thereof and a carrier assembly thereof, and more particularly to a portable electronic device, an image-capturing module thereof and a carrier assembly thereof for decreasing a width of a lens holder.

BACKGROUND OF THE INVENTION

The advantages of CMOS (Complementary Metal-Oxide-Semiconductor) are low power consumption and small size, thus allowing the CMOS sensor package module to be integrated into portable electronic devices with small size such as a mobile phone or a notebook. However, a width of a lens holder of the CMOS sensor package module cannot be decreased due to electronic components that are disposed on a PCB of the CMOS sensor package module.

SUMMARY OF THE INVENTION

One aspect of the present disclosure relates to a portable electronic device, and an image-capturing module thereof and a carrier assembly thereof.

One of the embodiments of the present disclosure provides an image-capturing module, including a circuit substrate, an image-sensing chip, at least one electronic component, a dispensing package, and a lens assembly. The circuit substrate has a top surface and a bottom surface. The image-sensing chip is electrically connected to the circuit substrate, and the image-sensing chip has an image-sensing area. The at least one electronic component is disposed on the bottom surface of the circuit substrate and electrically connected to the circuit substrate. The dispensing package is disposed on the bottom surface of the circuit substrate to cover the at least one electronic component. The lens assembly includes a holder structure disposed on the top surface of the circuit substrate and a lens structure being held by the holder structure and corresponding to the image-sensing area.

More particularly, the image-capturing module further includes at least one conductive body disposed on the bottom surface of the circuit substrate and electrically connected to the circuit substrate, the at least one conductive body is partially covered by the dispensing package, and a bottom surface of the at least one conductive body is exposed out of the dispensing package. The dispensing package has a flattening surface flush with the bottom surface of the at least one conductive body, the dispensing package surrounds the image-sensing chip, and the thickness of the dispensing package is greater than the thickness of the image-sensing chip. The circuit substrate has an unoccupied area that is disposed on the top surface thereof and surrounded by the holder structure.

More particularly, the image-capturing module further includes a heat-dissipating structure disposed on the flattening surface of the dispensing package for contacting the bottom surface of the at least one conductive body, and the image-sensing chip is adhered to the heat-dissipating structure through an adhesive. The circuit substrate has a through opening connected between the top surface and the bottom surface of the circuit substrate, the image-sensing chip is disposed on the bottom surface of the circuit substrate, and the image-sensing area of the image-sensing chip faces the through opening of the circuit substrate.

More particularly, the image-capturing module further includes a filter element disposed on one of the circuit substrate and the image-sensing chip, and the filter element is disposed between the image-sensing chip and the lens structure. The dispensing package has a surrounding extending portion for totally covering or partially covering a bottom surface of the image-sensing chip, and the dispensing package is surrounded and restricted by a surrounding frame that is disposed on the bottom surface of the circuit substrate.

Another one of the embodiments of the present disclosure provides a carrier assembly, including a circuit substrate, a dispensing package, and a holder structure. The circuit substrate is used for carrying at least one electronic component. The circuit substrate has a top surface and a bottom surface, and the at least one electronic component is disposed on the bottom surface of the circuit substrate and electrically connected to the circuit substrate. The dispensing package is disposed on the bottom surface of the circuit substrate to cover the at least one electronic component, and the holder structure is disposed on the top surface of the circuit substrate.

Yet another one of the embodiments of the present disclosure provides a portable electronic device using an image-capturing module, characterized in that the image-capturing module includes a circuit substrate, an image-sensing chip, at least one electronic component, a dispensing package, and a lens assembly. The circuit substrate has a top surface and a bottom surface. The image-sensing chip is electrically connected to the circuit substrate, and the image-sensing chip has an image-sensing area. The at least one electronic component is disposed on the bottom surface of the circuit substrate and electrically connected to the circuit substrate. The dispensing package is disposed on the bottom surface of the circuit substrate to cover the at least one electronic component. The lens assembly includes a holder structure disposed on the top surface of the circuit substrate and a lens structure held by the holder structure and corresponding to the image-sensing area.

Therefore, the horizontal width or the horizontal size of the holder structure can be decreased by matching the features of "the at least one electronic component being disposed on the bottom surface of the circuit substrate and electrically connected to the circuit substrate, and the dispensing package being disposed on the top surface of the circuit substrate to cover the at least one electronic component" and "the holder structure being disposed on the top surface of the circuit substrate".

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a portable electronic device and an image-capturing module thereof, and a carrier assembly thereof according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

[First Embodiment]

Figure 1:
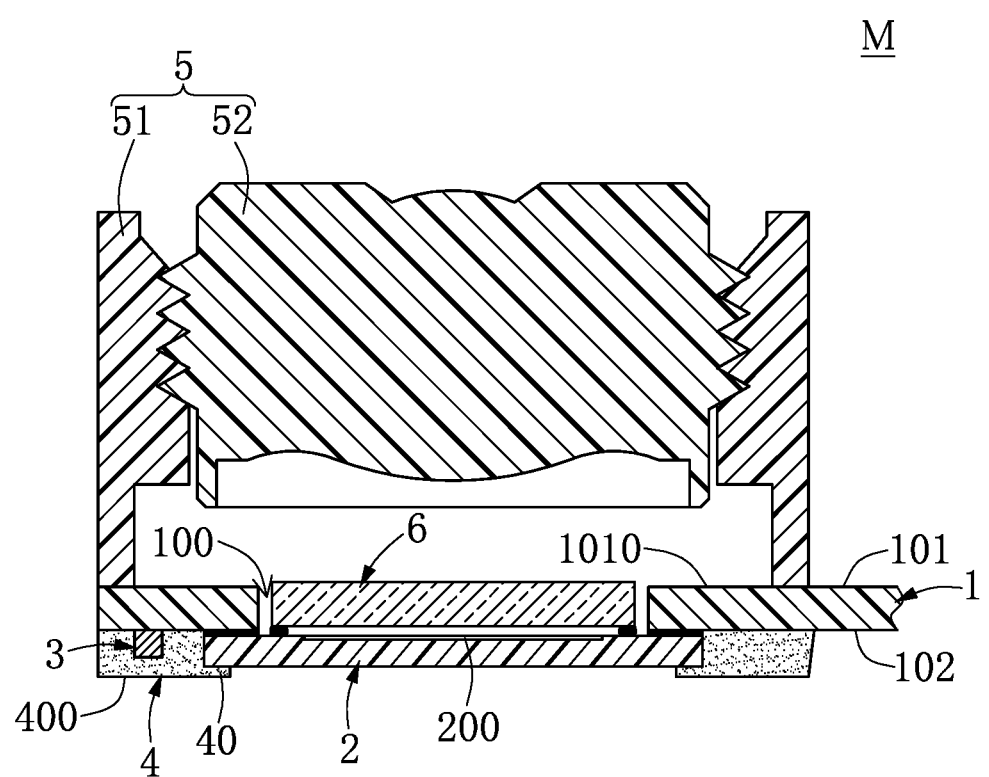
FIG. 1 shows a schematic view of an image-capturing module according to the first embodiment of the present disclosure.

Referring to FIG. 1, the first embodiment of the present disclosure provides an image-capturing module M, including a circuit substrate 1, an image-sensing chip 2, at least one electronic component 3, a dispensing package 4, and a lens assembly 5.

First, the circuit substrate 1 has a top surface 101 and a bottom surface 102. More particularly, the circuit substrate 1 has a through opening 100 connected between the top surface 101 and the bottom surface 102 of the circuit substrate 1. For example, the circuit substrate 1 may be a PCB rigid board (such as BT, FR4, or FR5 etc.), a rigid-flex board, or a ceramic board etc., but it is not meant to limit the scope of the present disclosure.

Moreover, the image-sensing chip 2 is electrically connected to the circuit substrate 1, and the image-sensing chip 2 has an image-sensing area 200. More particularly, the image-sensing chip 2 is disposed on the bottom surface 102 of the circuit substrate 1, and the image-sensing area 200 of the image-sensing chip 2 can face the through opening 100 of the circuit substrate 1. For example, the image-sensing chip 2 may be a CMOS (Complementary Metal-Oxide-Semiconductor) sensor or any kind of image sensor that can be used for capturing images, but it is not meant to limit the scope of the present disclosure.

Furthermore, the at least one electronic component 3 is disposed on the bottom surface 102 of the circuit substrate 1 and electrically connected to the circuit substrate 1. For example, the at least one electronic component 3 may be a passive component such as capacitor, resistor, drive IC, or EEPROM, but it is not meant to limit the scope of the present disclosure.

In addition, the dispensing package 4 is disposed on the bottom surface 102 of the circuit substrate 1 to cover the at least one electronic component 3. For example, the dispensing package 4 has a surrounding extending portion 40 for totally covering (enclosing) or partially covering a bottom surface of the image-sensing chip 2. Alternatively, the surrounding extending portion 40 can be omitted from the dispensing package 4, so that the whole bottom surface of the image-sensing chip 2 can be exposed out of the dispensing package 4. For another example, the dispensing package 4 can be formed as a dispensing base by dispensing epoxy glue or silicon glue, and the dispensing package 4 has a micrometer flattening surface 400 formed by fine grinding, but it is not meant to limit the scope of the present disclosure.

It should be noted that the dispensing package 4 is disposed on the bottom surface 102 of the circuit substrate 1 so as to increase the structural strength of the circuit substrate 1 due to the support of the dispensing package 4, so that the rigidity of the circuit substrate 1 can be increased without causing warpage.

Moreover, the lens assembly 5 includes a holder structure 51 (i.e., a lens holder) disposed on the top surface 101 of the circuit substrate 1 and a lens structure 52 being held or supported by the holder structure 51 and corresponding to the image-sensing area 200 of the image-sensing chip 2. For example, the holder structure 51 may be a fixed seat or a voice coil motor (VCM), and the lens structure 52 may be composed of many lenses, but it is not meant to limit the scope of the present disclosure. In addition, for example, the holder structure 51 can be disposed on the top surface 101 of the circuit substrate 1 through an adhesive paste (not shown), but it is not meant to limit the scope of the present disclosure.

For example, the circuit substrate 1 has an unoccupied area 1010 (such as a non-component region) that is disposed on the top surface 101 thereof and surrounded by the holder structure 51. That is to say, all of the electronic components (such as the at least one electronic component 3) are disposed on the bottom surface 102 of the circuit substrate 1, so that no electronic component is disposed on the unoccupied area 1010 of the top surface 101 of the circuit substrate 1. Therefore, the holder structure 51 can be disposed on the unoccupied area 1010 of the top surface 101 of the circuit substrate 1. However, the foregoing disposition is not meant to limit the scope of the present disclosure; for example, any passive component can be disposed on the top surface 101 and the bottom surface 102 of the circuit substrate 1.

It should be noted that the image-capturing module M further includes a filter element 6 disposed on one of the circuit substrate 1 and the image-sensing chip 2, and the filter element 6 is disposed between the image-sensing chip 2 and the lens structure 52. For example, the filter element 6 can be disposed on the image-sensing chip 2 (as shown in FIG. 1), or the filter element 6 can be supported above the image-sensing chip 2 through spacers (not shown). In addition, the filter element 6 may be a coated glass or a non-coated glass, but it is merely an example and is not meant to limit the scope of the present disclosure.

It should be noted that the dispensing package 4 further has a protection layer formed on the outer surface thereof. For example, the dispensing package 4 has a dustproof coating disposed on the outer surface thereof so as to prevent dust particles from being attached to the dispensing package 4, but it is not meant to limit the scope of the present disclosure.

In conclusion, the holder structure 51 and the electronic component 3 are disposed on two opposite surfaces of the circuit substrate 1, so that the horizontal width or the horizontal size of the holder structure 51 can be decreased. That is to say, the holder structure 51 can be disposed on the unoccupied area 1010 of the top surface 101 of the circuit substrate 1 without moving away horizontally from the electronic component 3, so that the horizontal width (i.e., the width in a horizontal direction, such as X direction width or Y direction width) of the holder structure 51 can be decreased, or the horizontal size (i.e., the size in a horizontal direction) of the holder structure 51 can be decreased.

Figure 2:
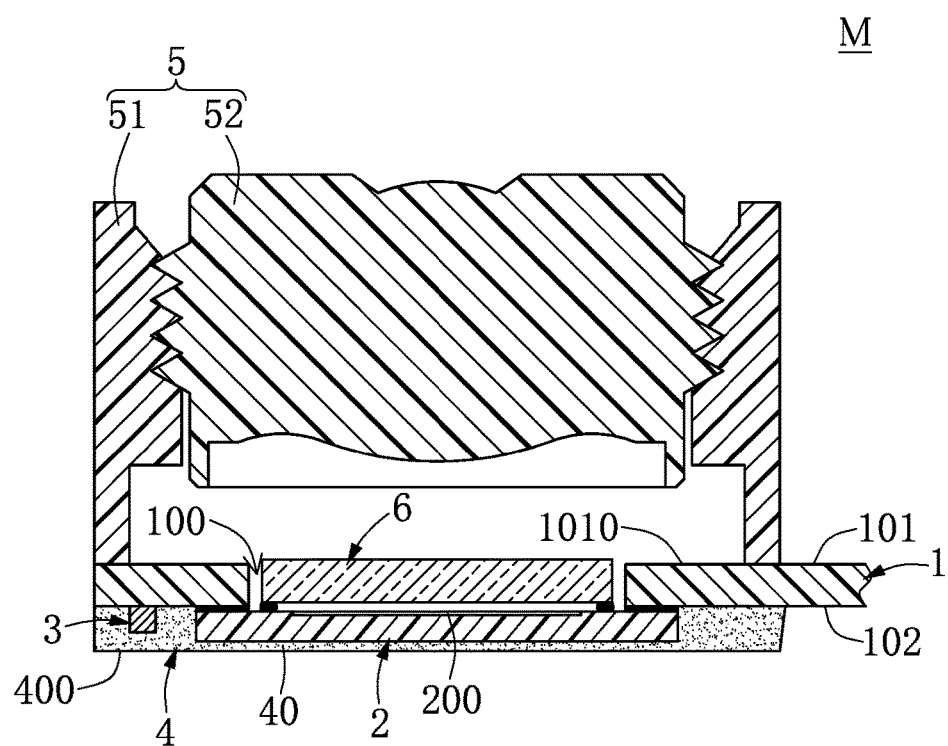
FIG. 2 shows a schematic view of a surrounding extending portion of the dispensing package for totally covering a bottom surface of an image-sensing chip according to the first embodiment of the present disclosure.

It should be noted that when the bottom surface of the image-sensing chip 2 is totally covered by the surrounding extending portion 40 of the dispensing package 4 as shown in FIG. 2, the heat-dissipating efficiency of the image-sensing chip 2 can be increased due to the dispensing package 4 that can be made of heat dissipation glue.

Figure 3:
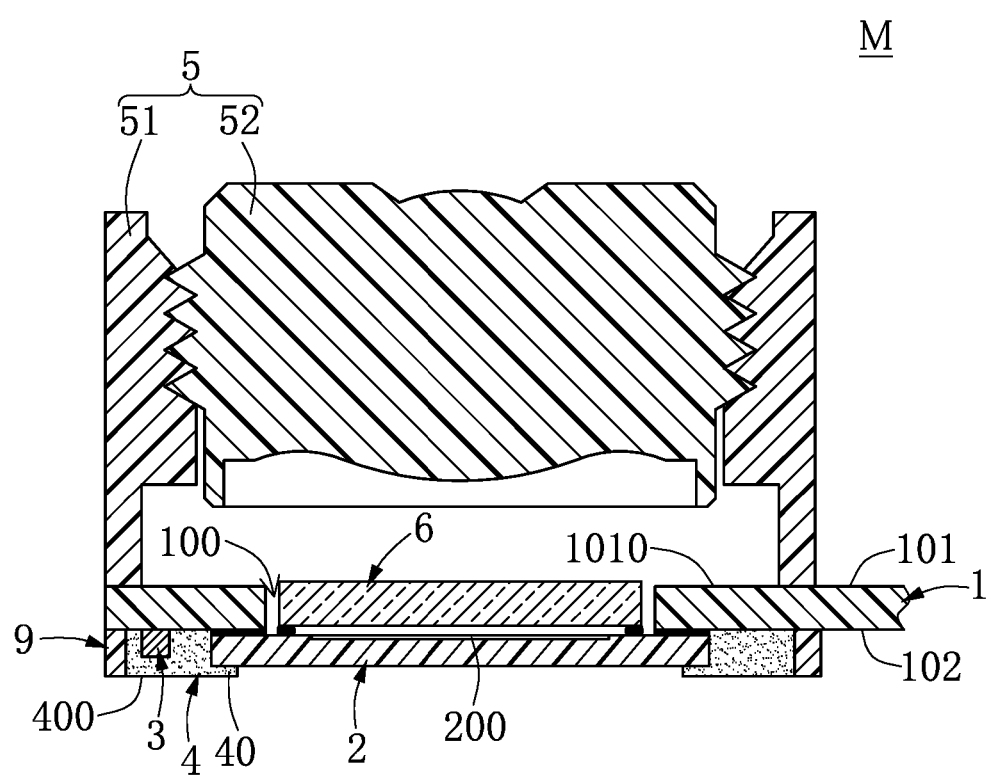
FIG. 3 shows a schematic view of the dispensing package when being surrounded and restricted by a surrounding frame according to the first embodiment of the present disclosure.

It should be noted that the dispensing package 4 is surrounded and restricted by a surrounding frame 9 (such as a position limiting frame) that is disposed on the bottom surface 120 of the circuit substrate 1 as shown in FIG. 3. That is to say, when the dispensing package 4 is made of low viscosity material, the surrounding frame 9 can be used as a surrounding dam so as to restrict the forming range of the dispensing package 4, but it is not meant to limit the scope of the present disclosure. For another example, the dispensing package 4 can be made of high viscosity material, so that the surrounding frame 9 can be omitted from the image-capturing module M as shown in FIG. 1 or FIG. 2.

Figure 4:
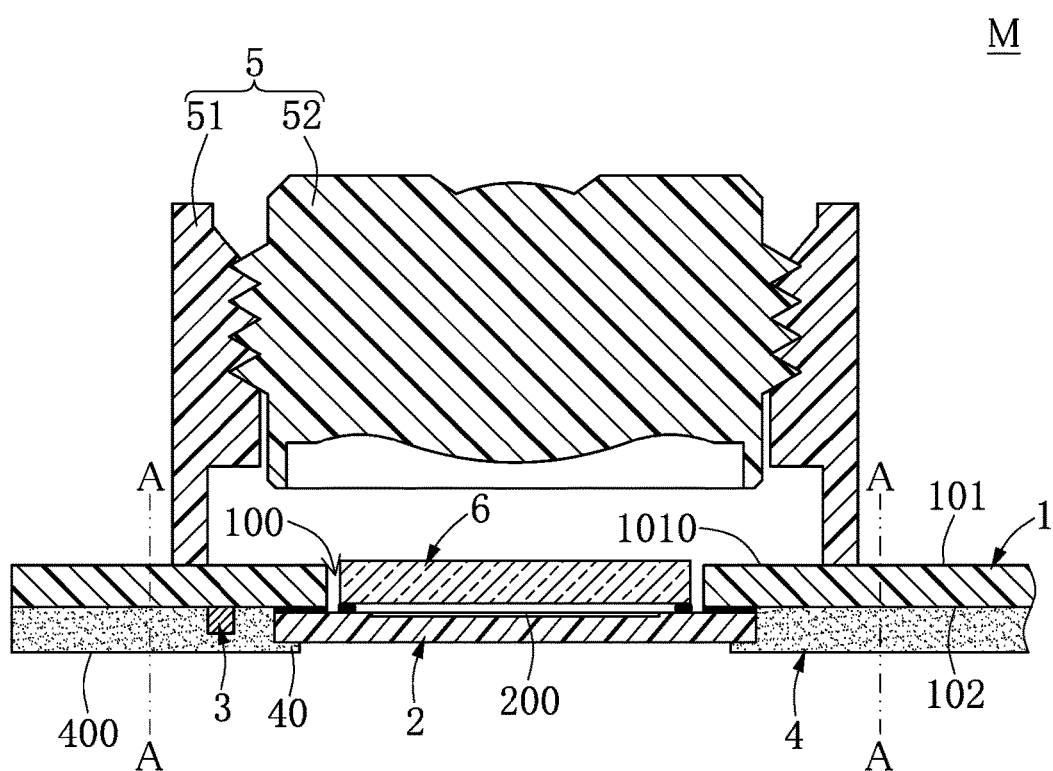
FIG. 4 shows a schematic view of a circuit substrate of the image-capturing module before being cut according to the first embodiment of the present disclosure.
Figure 5:
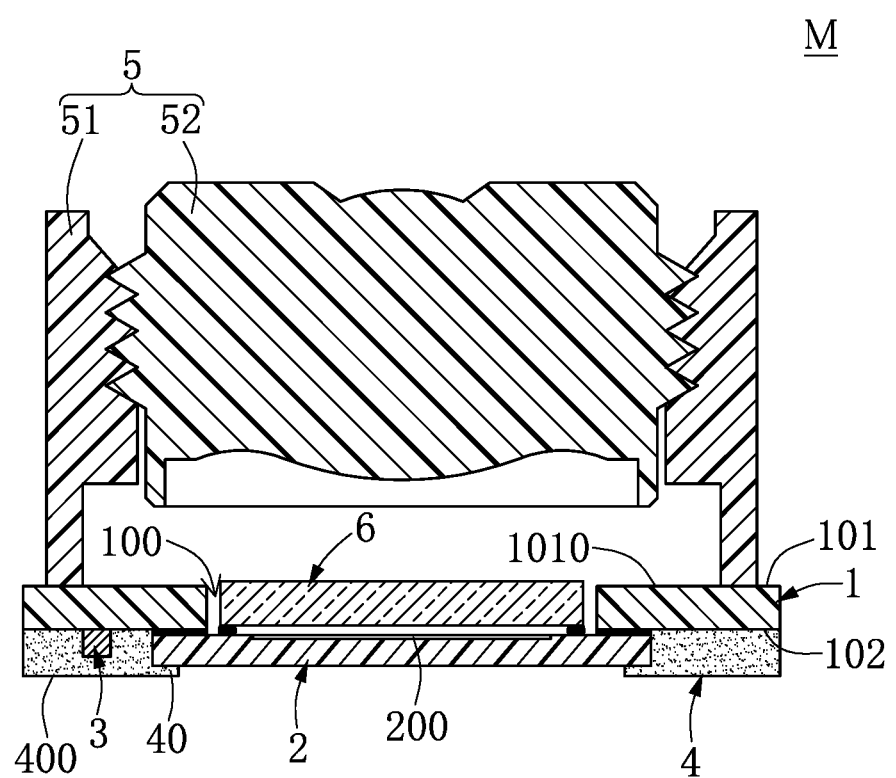
FIG. 5 shows a schematic view of the circuit substrate of the image-capturing module after being cut according to the first embodiment of the present disclosure.

It should be noted that the present disclosure can use a circuit substrate 1 of big load area in advance as shown in FIG. 4 and FIG. 5. After the image-capturing module M has been manufactured as shown in FIG. 4, the circuit substrate 1 is cut along the A-A section to obtain the image-capturing module M of small size that the user needs as shown in FIG. 5. Hence, the horizontal width (i.e., the width in a horizontal direction, such as X direction width or Y direction width) of the image-capturing module M can be decreased.

[Second Embodiment]

Figure 6:
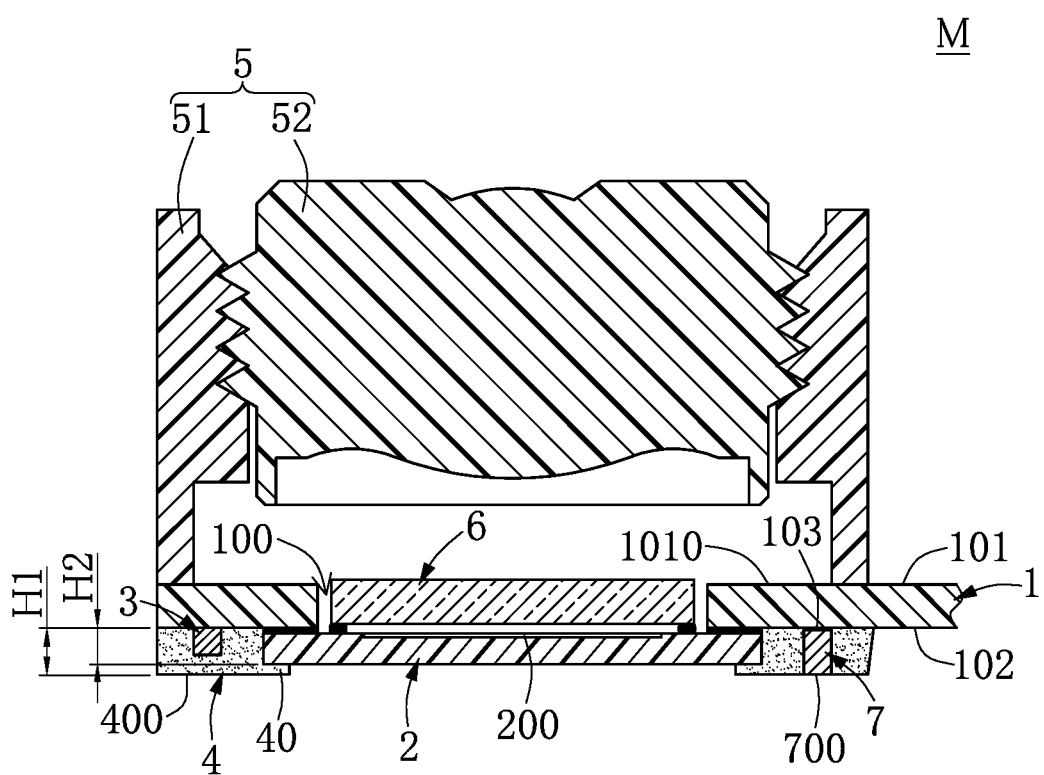
FIG. 6 shows a schematic view of the image-capturing module according to the second embodiment of the present disclosure.

Referring to FIG. 6, the second embodiment of the present disclosure provides an image-capturing module M, including a circuit substrate 1, an image-sensing chip 2, at least one electronic component 3, a dispensing package 4, and a lens assembly 5. Comparing FIG. 6 with FIG. 1, the difference between the second embodiment and the first embodiment is as follows: in the second embodiment, the image-capturing module M further includes at least one conductive body 7 disposed on the bottom surface 102 of the circuit substrate 1 and electrically connected to the circuit substrate 1.

As described above, the at least one conductive body 7 is partially covered by the dispensing package 4, and a bottom surface 700 of the at least one conductive body 7 is exposed out of the dispensing package 4. For example, the at least one conductive body 7 is electrically connected to a ground area 103 of the circuit substrate 1, and the ground area 103 of the circuit substrate 1 can be electrically connected to a ground area of an application system (not shown) through the at least one conductive body 7, so that the image-capturing module M can provide electrostatic discharge (ESD) and electromagnetic disturbance (EMI) functions according to different requirements. In addition, the at least one conductive body 7 may be a conductive element such as copper pillar, solder ball, or an electronic component etc., but it is merely an example and is not meant to limit the scope of the present disclosure.

It should be noted that the dispensing package 4 is disposed on the bottom surface 102 of the circuit substrate 1 to surround the image-sensing chip 2, and the thickness H1 of the dispensing package 4 is greater than the thickness H2 of the image-sensing chip 2. Therefore, the thickness H1 of the dispensing package 4 is greater than the thickness H2 of the image-sensing chip 2, so that the distance from the top side of the dispensing package 4 to the bottom surface 102 of the circuit substrate 1 is greater than the distance from the top side of the image-sensing chip 2 to the bottom surface 102 of the circuit substrate 1. The dispensing package 4 can be used to protect the image-sensing chip 2 and prevent the image-sensing chip 2 from collision with foreign objects.

It should be noted that the image-capturing module M of the second embodiment can also be manufactured according to the structure provided by FIG. 2, FIG. 3, or FIG. 4 to FIG. 5 of the first embodiment.

[Third Embodiment]

Figure 7:
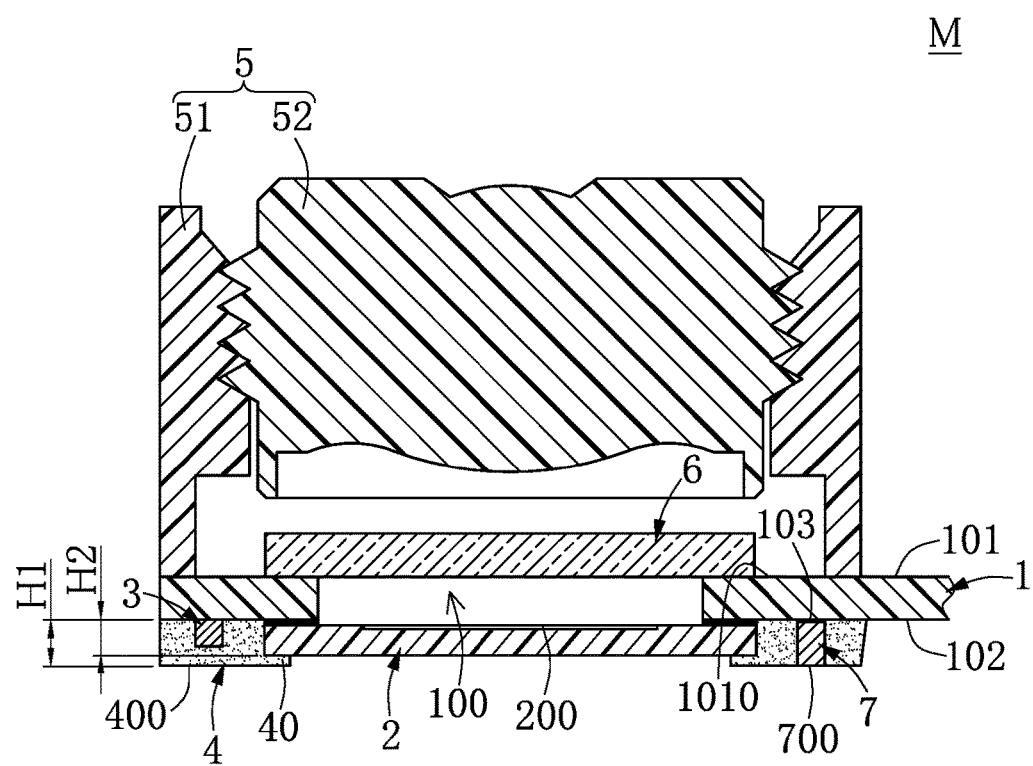
FIG. 7 shows a schematic view of the image-capturing module according to the third embodiment of the present disclosure.

Referring to FIG. 7, the third embodiment of the present disclosure provides an image-capturing module M, including a circuit substrate 1, an image-sensing chip 2, at least one electronic component 3, a dispensing package 4, and a lens assembly 5. Comparing FIG. 7 with FIG. 6, the difference between the third embodiment and the second embodiment is as follows: in the third embodiment, the filter element 6 is directly disposed on the circuit substrate 1 and spaced apart from the image-sensing chip 2.

That is to say, the filter element 6 can be disposed on the image-sensing chip 2 (shown as the first embodiment in FIG. 1), or the circuit substrate 1 (shown as the third embodiment in FIG. 7) according to different requirements.

Figure 8:
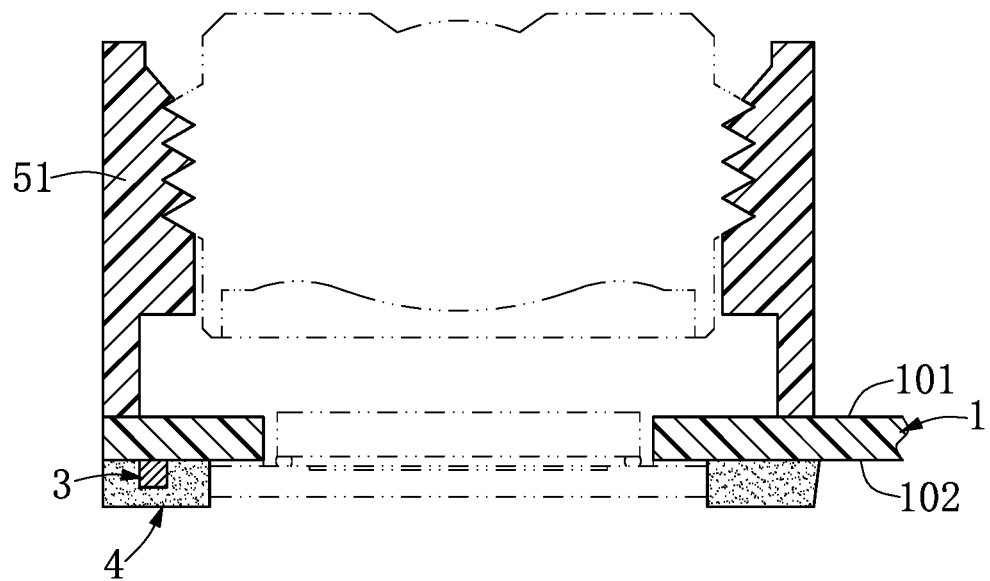
FIG. 8 shows a schematic view of a carrier assembly according to the present disclosure.

It should be noted that the present invention further provides a carrier assembly S, including a circuit substrate 1, a dispensing package 4, and a holder structure 51 as shown in FIG. 8. The circuit substrate 1 can be used for carrying at least one electronic component 3, and the at least one electronic component 3 is disposed on the bottom surface 102 of the circuit substrate 1 and electrically connected to the circuit substrate 1. The dispensing package 4 is disposed on the bottom surface 102 of the circuit substrate 1 to cover or enclose the at least one electronic component 3, and the holder structure 51 is disposed on the top surface 101 of the dispensing package 4.

That is to say, the carrier assembly S as shown in FIG. 8 can also be used for purposes other than carrying the image-sensing chip 2 and the lens structure 52 as shown in the first to the third embodiments.

It should be noted that the image-capturing module M of the third embodiment can also be manufactured according to the structure provided by FIG. 2, FIG. 3, or FIG. 4 to FIG. 5 of the first embodiment.

[Fourth Embodiment]

Figure 9:
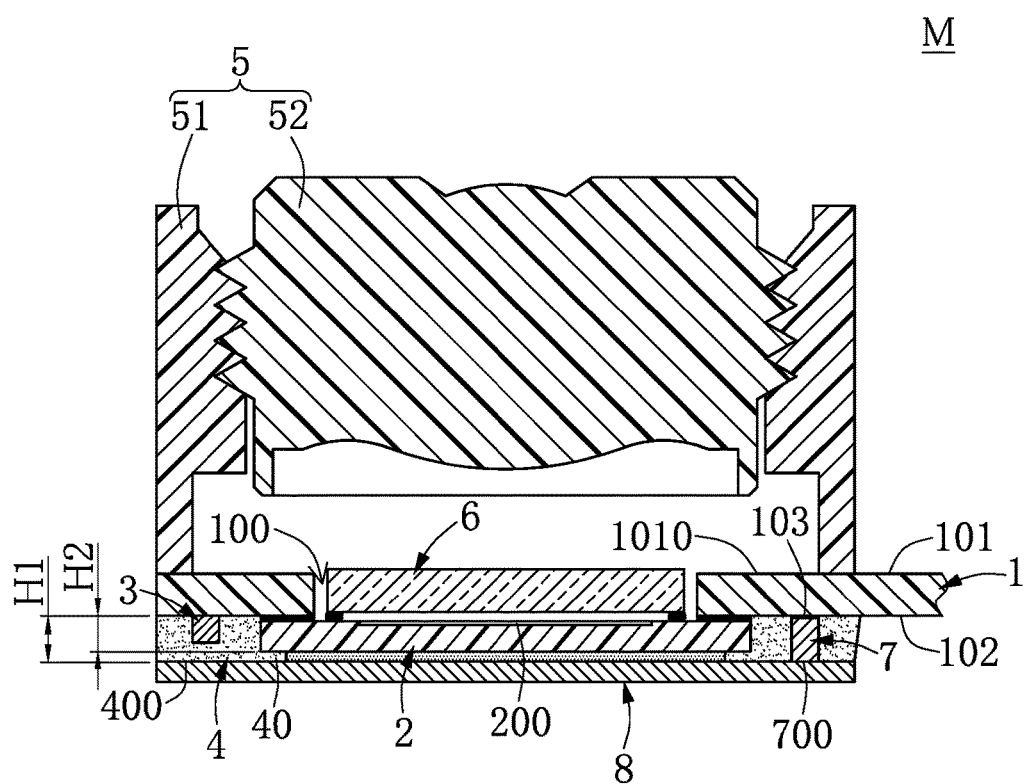
FIG. 9 shows a schematic view of the image-capturing module according to the fourth embodiment of the present disclosure.

Referring to FIG. 9, the fourth embodiment of the present disclosure provides an image-capturing module M, including a circuit substrate 1, an image-sensing chip 2, at least one electronic component 3, a dispensing package 4, and a lens assembly 5. Comparing FIG. 9 with FIG. 6, the difference between the fourth embodiment and the second embodiment is as follows: in the fourth embodiment, the image-capturing module M further includes a heat-dissipating structure 8 disposed on the flattening surface 400 of the dispensing package 4 for contacting the bottom surface 700 of the at least one conductive body 7.

As described above, the image-sensing chip 2 can be adhered to the heat-dissipating structure 8 through an adhesive (not labeled) so as to increase the heat-dissipating efficiency of the image-sensing chip 2. In addition, the dispensing package 4 has a flattening surface 400 flush with the bottom surface 700 of the at least one conductive body 7, so that the flattening surface 400 can be used as a carrier base for carrying the heat-dissipating structure 8. For example, the heat-dissipating structure 8 may be a conductive element such as a steel plate, a copper sheet, or a copper foil, etc., but it is not meant to limit the scope of the present disclosure.

It should be noted that the at least one conductive body 7 is electrically connected to a ground area 103 of the circuit substrate 1, and the ground area 103 of the circuit substrate 1 can be electrically connected to a ground area of an application system (not shown) through the at least one conductive body 7 and the heat-dissipating structure 8 in sequence, so that the image-capturing module M can provide electrostatic discharge (ESD) and electromagnetic disturbance (EMI) functions according to different requirements It should be noted that the image-capturing module M of the fourth embodiment can also be manufactured according to the structure provided by FIG. 2, FIG. 3, or FIG. 4 to FIG. 5 of the first embodiment.

[Fifth Embodiment]

Figure 10:
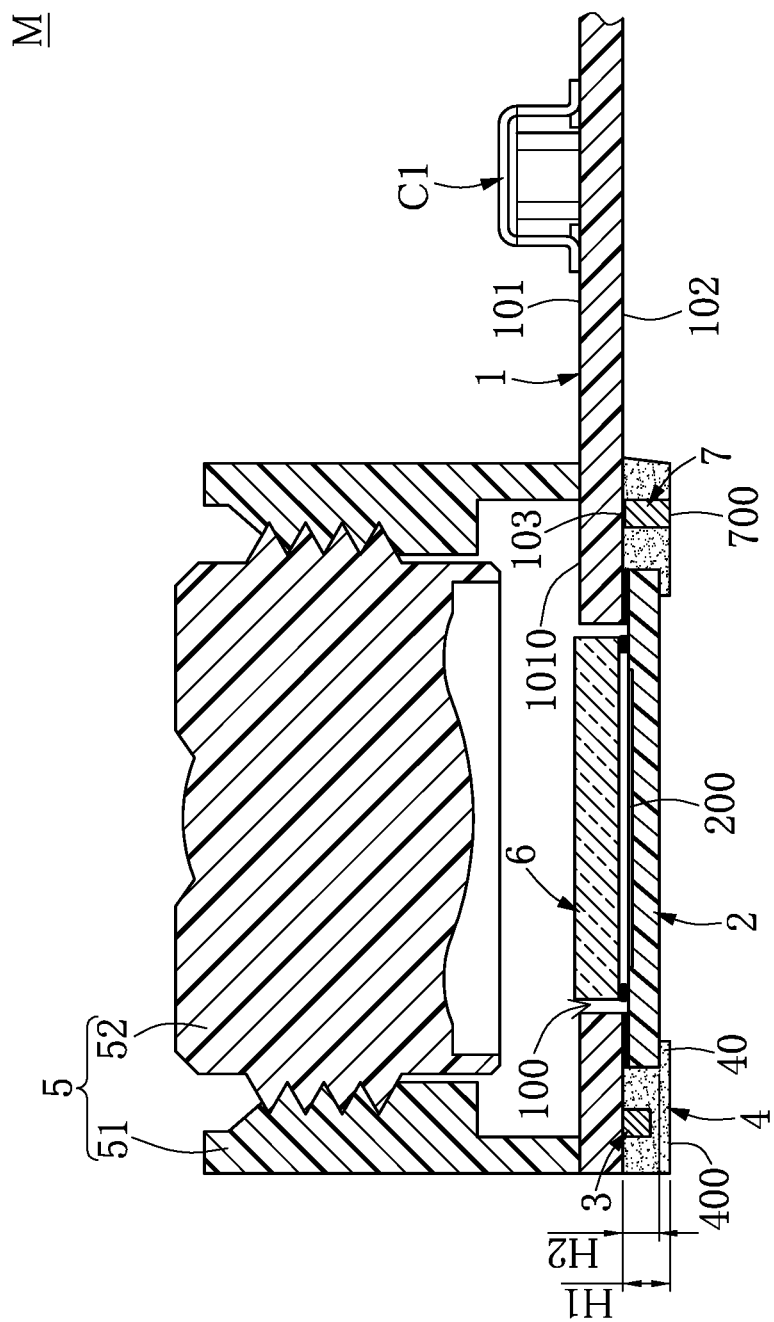
FIG. 10 shows a schematic view of the image-capturing module according to the fifth embodiment of the present disclosure.

Referring to FIG. 10, the fifth embodiment of the present disclosure provides an image-capturing module M, including a circuit substrate 1, an image-sensing chip 2, at least one electronic component 3, a dispensing package 4, and a lens assembly 5. Comparing FIG. 10 with FIG. 6, the difference between the fifth embodiment and the second embodiment is as follows: in the fifth embodiment, the circuit substrate 1 further includes an electrical connector C1, so that the image-capturing module M can be electrically connected to a terminal electronic module (not shown) through the electrical connector C1.

It should be noted that the image-capturing module M of the fifth embodiment can also be manufactured according to the structure provided by FIG. 2, FIG. 3, or FIG. 4 to FIG. 5 of the first embodiment.

[Sixth Embodiment]

Figure 11:
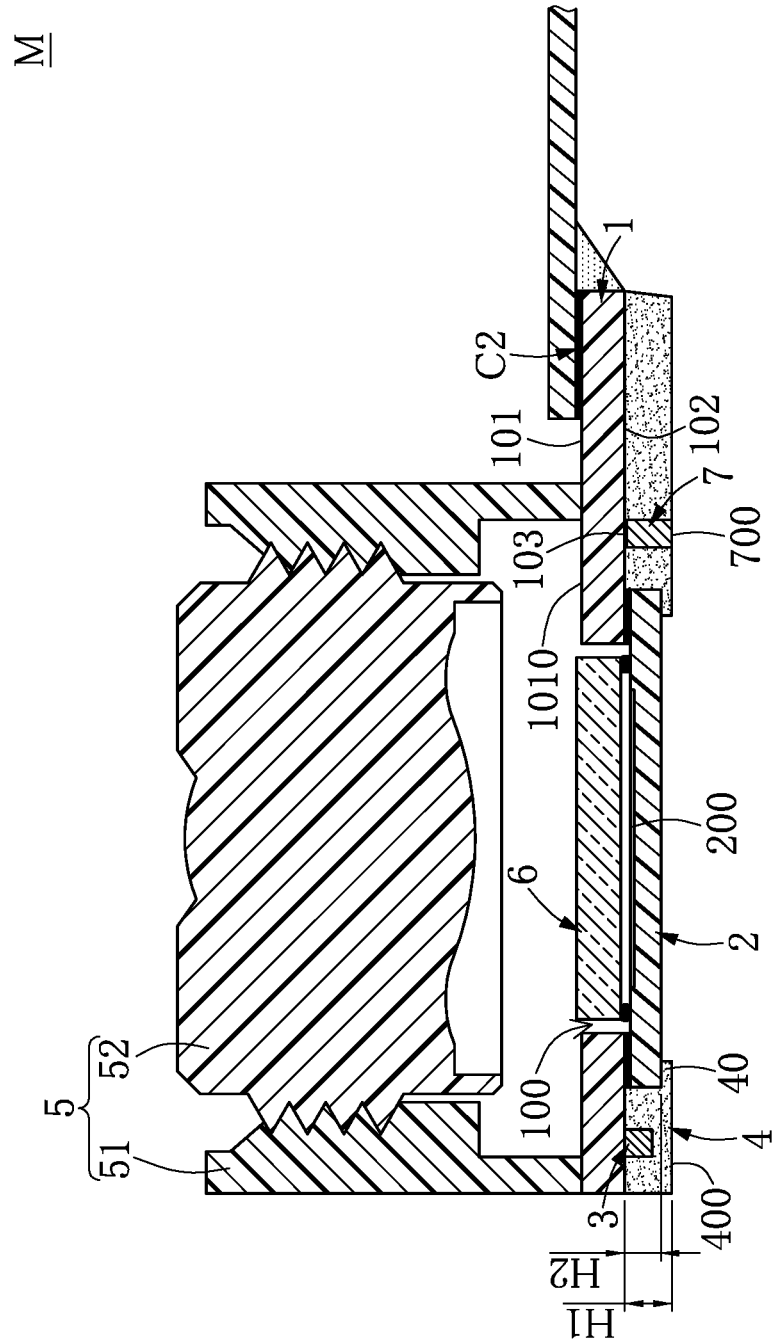
FIG. 11 shows a schematic view of the image-capturing module according to the sixth embodiment of the present disclosure.

Referring to FIG. 11, the sixth embodiment of the present disclosure provides an image-capturing module M, including a circuit substrate 1, an image-sensing chip 2, at least one electronic component 3, a dispensing package 4, and a lens assembly 5. Comparing FIG. 11 with FIG. 6, the difference between the sixth embodiment and the second embodiment is as follows: in the sixth embodiment, the image-capturing module M can be electrically bonded on a flexible PCB (not labeled) through a conductive structure C2 (such as hot bar or ACF), so that the image-capturing module M can be electrically connected to a terminal electronic module (not shown) through the flexible PCB. Therefore, the image-capturing module M can be electrically bonded on different flexible PCBs (not labeled) through the conductive structure C2 according to different requirements so as to increase the shareability of the image-capturing module M.

It should be noted that the image-capturing module M of the sixth embodiment can also be manufactured according to the structure provided by FIG. 2, FIG. 3, or FIG. 4 to FIG. 5 of the first embodiment.

[Seventh Embodiment]

Figure 12:
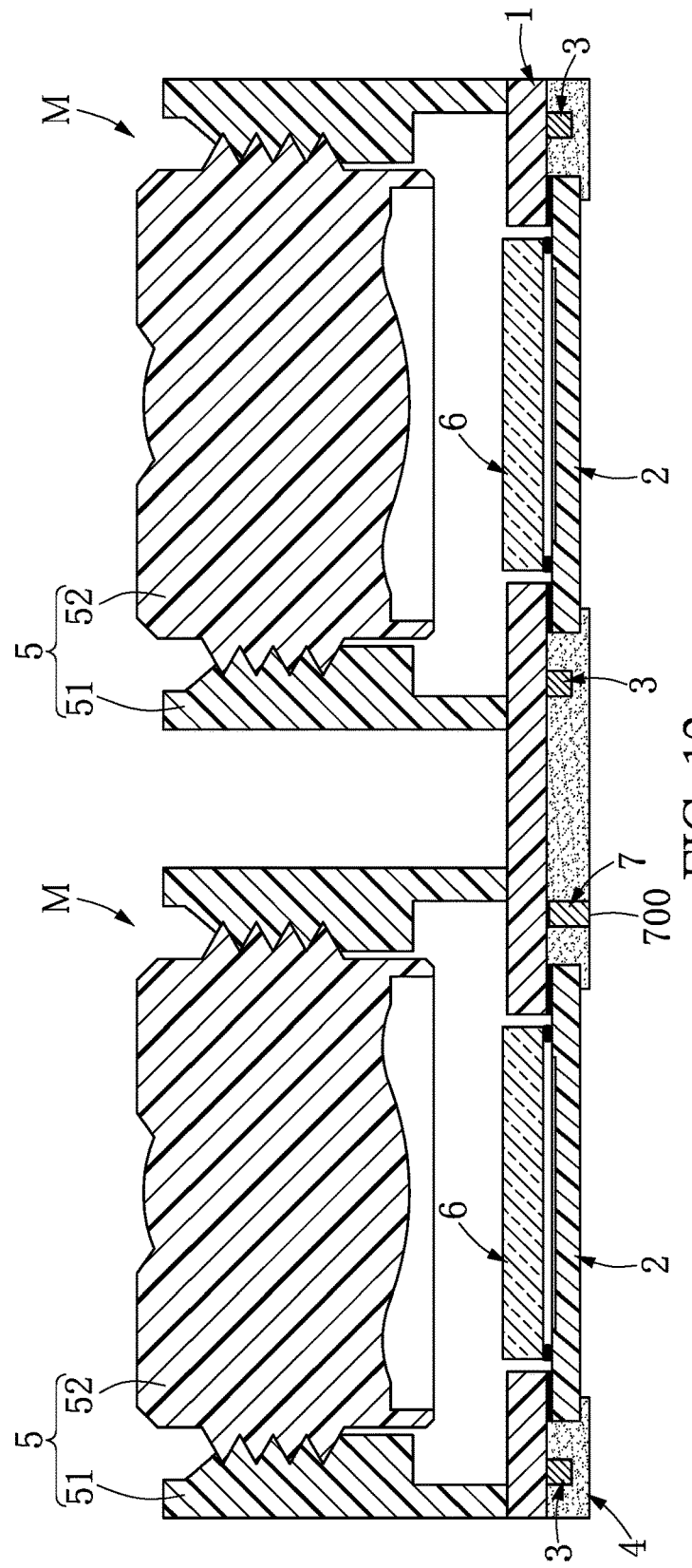
FIG. 12 shows a schematic view of the image-capturing module according to the seventh embodiment of the present disclosure.

Referring to FIG. 12, the seventh embodiment of the present disclosure provides two image-capturing modules M. Comparing FIG. 12 with FIG. 6, the difference between the seventh embodiment and the second embodiment is as follows: the seventh embodiment can use two image-capturing modules M (i.e., a dual camera) at the same time, and the two image-capturing modules M can share the same dispensing package 4 and the same conductive body 7 according to different requirements.

It should be noted that the image-capturing module M of the seventh embodiment can also be manufactured according to the structure provided by FIG. 2, FIG. 3, or FIG. 4 to FIG. 5 of the first embodiment.

[Eighth Embodiment]

Figure 13:
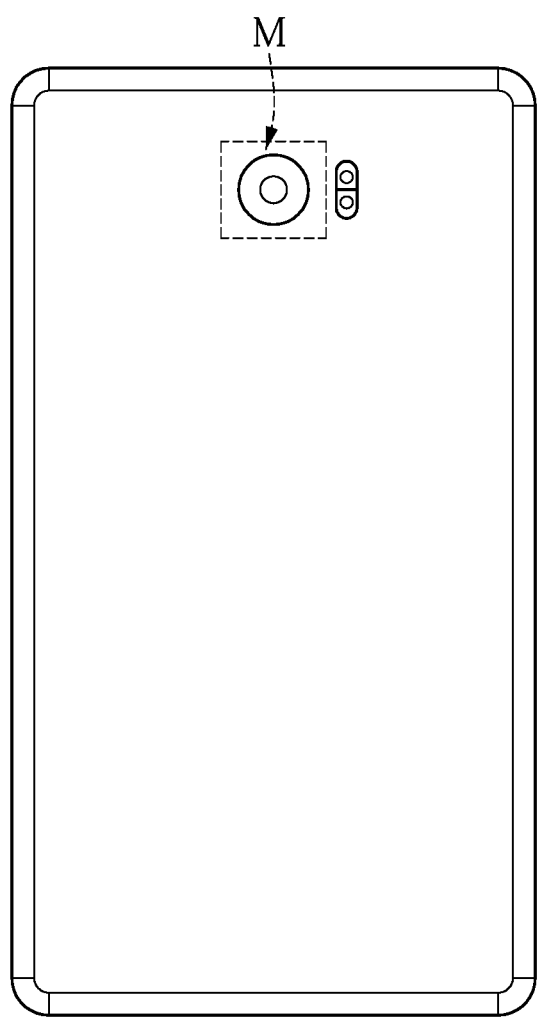
FIG. 13 shows a schematic view of a portable electronic device according to the eighth embodiment of the present disclosure.

Referring to FIG. 13, the eighth embodiment of the present disclosure provides a portable electronic device P using an image-capturing module M of any one of the first to the seventh embodiments. For example, the electronic device P may be a smart phone, a laptop, or a tablet computer, but it is not meant to limit the scope of the present disclosure. As shown in FIG. 13, the image-capturing module M can be used as a rear lens of the portable electronic device P, and the image-capturing module M includes a circuit substrate 1, an image-sensing chip 2, at least one electronic component 3, a dispensing package 4, and a lens assembly 5, but it is merely an example and is not meant to limit the scope of the present disclosure.

Therefore, the horizontal width or the horizontal size of the holder structure 51 can be decreased by matching the features of "the at least one electronic component 3 being disposed on the bottom surface 102 of the circuit substrate 1 and electrically connected to the circuit substrate 1, and the dispensing package 4 being disposed on the bottom surface 102 of the circuit substrate 1 to cover the at least one electronic component 3" and "the holder structure 51 being disposed on the top surface 101 of the circuit substrate 1". That is to say, the holder structure 51 can be disposed on the unoccupied area 1010 of the top surface 101 of the circuit substrate 1 without horizontally moving away from the electronic component 3, so that the horizontal width (i.e., the width in a horizontal direction, such as X direction width or Y direction width) of the holder structure 51 can be decreased, or the horizontal size (i.e., the size in a horizontal direction) of the holder structure 51 can be decreased.

It should be noted that the dispensing package 4 is disposed on the bottom surface 102 of the circuit substrate 1 so as to increase the structural strength of the circuit substrate 1 due to the support of the dispensing package 4, so that the rigidity of the circuit substrate 1 can be increased without causing warpage.

It should be noted that when the bottom surface of the image-sensing chip 2 is totally covered by the surrounding extending portion 40 of the dispensing package 4, the heat-dissipating efficiency of the image-sensing chip 2 can be increased due to the dispensing package 4 that can be made of heat dissipation glue.

It should be noted that the dispensing package 4 is surrounded and restricted by a surrounding frame 9 that is disposed on the bottom surface 120 of the circuit substrate 1. That is to say, when the dispensing package 4 is made of low viscosity material, the surrounding frame 9 can be used as a surrounding dam so as to restrict the forming range of the dispensing package 4. For another example, the dispensing package 4 can be made of high viscosity material, so that the surrounding frame 9 can be omitted from the image-capturing module M.

It should be noted that a circuit substrate 1 with a big load area can be used in advance for the present disclosure. After the image-capturing module M has been manufactured, the circuit substrate 1 is cut along the A-A section to obtain the image-capturing module M of small size as needed by the user. Hence, the horizontal width of the image-capturing module M can be decreased.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. An image-capturing module, comprising:
   a circuit substrate having a top surface and a bottom surface;
   an image-sensing chip electrically connected to the circuit substrate, wherein the image-sensing chip has an image-sensing area;
   at least one electronic component disposed on the bottom surface of the circuit substrate and electrically connected to the circuit substrate;
   a dispensing package disposed on the bottom surface of the circuit substrate to cover the at least one electronic component;
   a lens assembly including a holder structure disposed on the top surface of the circuit substrate and a lens structure being held by the holder structure and corresponding to the image-sensing area; and
   a filter element disposed on the image-sensing chip, and the filter element disposed in a through opening formed between the top surface and the bottom surface of the circuit substrate.

2. The image-capturing module of claim 1, further comprising at least one conductive body disposed on the bottom surface of the circuit substrate and electrically connected to the circuit substrate, the at least one conductive body being partially covered by the dispensing package, and a bottom surface of the at least one conductive body being exposed out of the dispensing package, wherein the dispensing package has a flattening surface flush with the bottom surface of the at least one conductive body, the dispensing package surrounds the image-sensing chip, and the thickness of the dispensing package is greater than the thickness of the image-sensing chip, and wherein the circuit substrate has an unoccupied area that is disposed on the top surface thereof and surrounded by the holder structure.

3. The image-capturing module of claim 2, further comprising a heat-dissipating structure disposed on the flattening surface of the dispensing package for contacting the bottom surface of the at least one conductive body, and the image-sensing chip being adhered to the heat-dissipating structure through an adhesive, the image-sensing chip is disposed on the bottom surface of the circuit substrate, and the image-sensing area of the image-sensing chip faces the through opening of the circuit substrate.

4. (Withdrawn-Previously presented) The image-capturing module of claim 3, wherein the filter element is disposed between the image-sensing chip and the lens structure, the dispensing package has a surrounding extending portion for totally covering or partially covering a bottom surface of the image-sensing chip, and the dispensing package is surrounded and restricted by a surrounding frame that is disposed on the bottom surface of the circuit substrate.

5. A carrier assembly, comprising:
   a circuit substrate for carrying at least one electronic component, wherein the circuit substrate has a top surface and a bottom surface, and the at least one electronic component is disposed on the bottom surface of the circuit substrate and electrically connected to the circuit substrate;
   a dispensing package disposed on the bottom surface of the circuit substrate to cover the at least one electronic component; and
   a holder structure disposed on the top surface of the circuit substrate and directly contacting the circuit substrate;
   wherein an unoccupied area is defined on the top surface of the circuit substrate by the holder structure, and the unoccupied area being surrounded by the holder structure.

6. The carrier assembly of claim 5, further comprising:
   at least one conductive body; and
   a heat-dissipating structure;
   wherein the at least one conductive body is disposed on the bottom surface of the circuit substrate and electrically connected to the circuit substrate, the at least one conductive body is partially covered by the dispensing package, and a bottom surface of the at least one conductive body is exposed out of the dispensing package;
   wherein the dispensing package has a flattening surface flush with the bottom surface of the at least one conductive body, and the heat-dissipating structure is disposed on the flattening surface of the dispensing package for contacting the bottom surface of the at least one conductive body.

* * * * *